United States Patent [19]

Finicle

[11] Patent Number: 5,032,366
[45] Date of Patent: Jul. 16, 1991

[54] BORON NITRIDE BOAT AND PROCESS FOR PRODUCING IT

[75] Inventor: Robert L. Finicle, Bay Village, Ohio

[73] Assignee: Union Carbide Coatings Service Technology Corporation, Danbury, Conn.

[21] Appl. No.: 516,910

[22] Filed: Apr. 30, 1990

[51] Int. Cl.⁵ .............................................. H05B 3/12
[52] U.S. Cl. .......................... 422/248; 156/DIG. 83; 156/DIG. 86; 427/50; 427/113; 427/255.1
[58] Field of Search ............... 156/DIG. 83, DIG. 86, 156/DIG. 90; 427/50, 113, 255.1; 432/465

[56] References Cited

U.S. PATENT DOCUMENTS

| | | | |
|---|---|---|---|
| 3,152,006 | 10/1964 | Basche | 117/106 |
| 3,544,486 | 12/1970 | Passmore | 427/50 |
| 3,903,347 | 9/1975 | Galasso et al. | 427/113 |
| 4,142,008 | 2/1979 | DeBolt | 427/113 |
| 4,264,803 | 4/1981 | Shinko | 219/275 |

FOREIGN PATENT DOCUMENTS 2532194 3/1984 France ..................... 156/DIG. 83

OTHER PUBLICATIONS

"Advances in Gallium Arsenide Crystal Growth", R. K. Willardson, Advanced Materials and Processes, Jun. 1986, pp. 24–29.
Boralloy® Pyrolytic Boron Nitride, Union Carbide Corporation, copyright 1984, 1987 Sales Literature.

Primary Examiner—Olik Chaudhuri
Assistant Examiner—Felisa Garrett-Meza
Attorney, Agent, or Firm—Cornelius F. O'Brien

[57] ABSTRACT

A pyrolytic boron nitride boat having a cavity suitable for use in growing and doping semi-conductor crystals such as gallium arsenide and said cavity having a roughened surface formed of substantially uniform projected nodules, disturbances, or ridges.

18 Claims, 1 Drawing Sheet

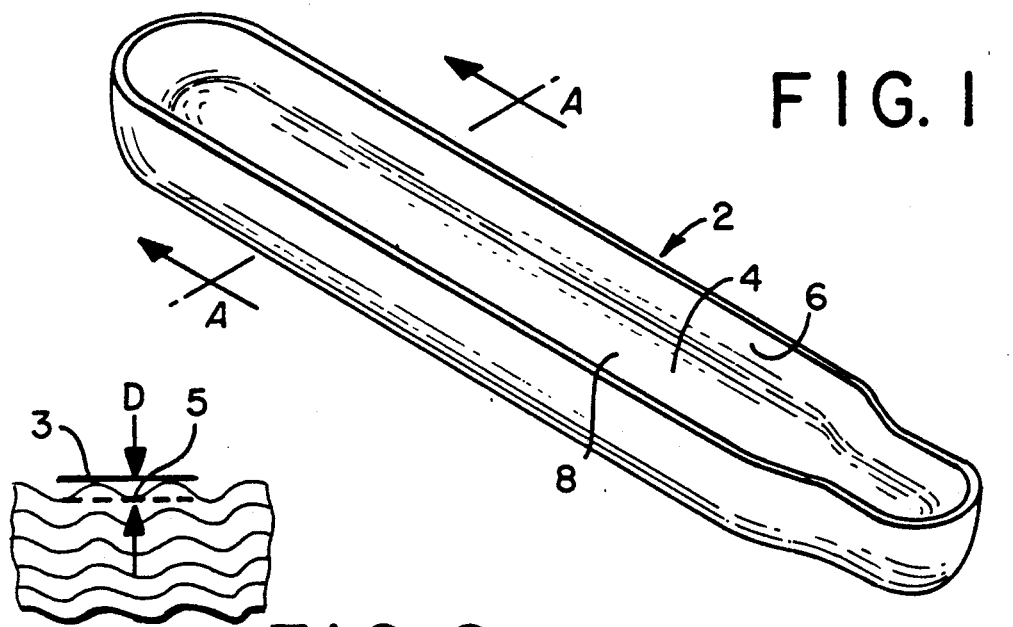
FIG. 1
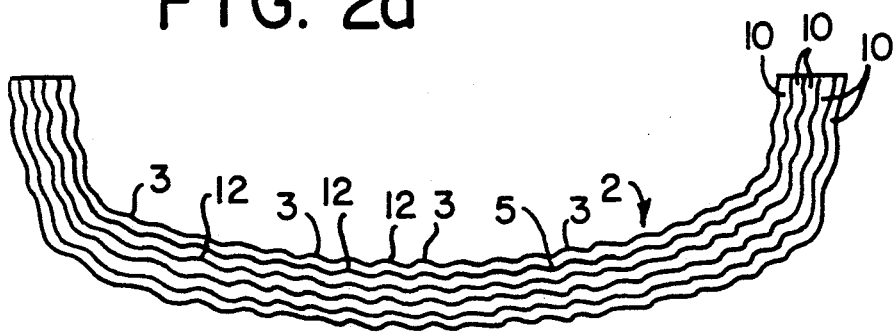
FIG. 2a
FIG. 2
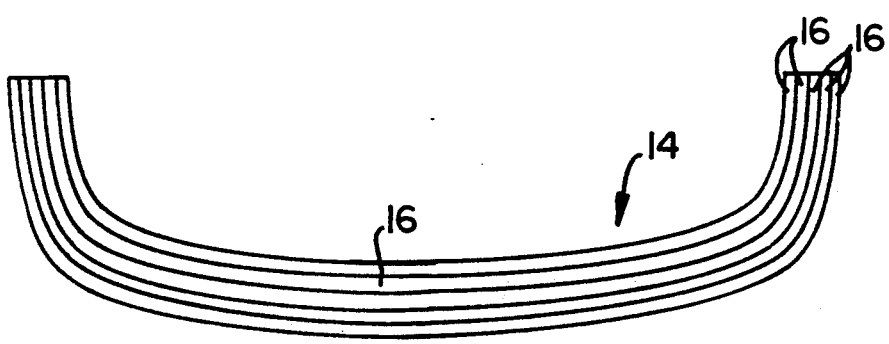
FIG. 3

BORON NITRIDE BOAT AND PROCESS FOR PRODUCING IT

FIELD OF THE INVENTION

This invention relates to an improved boron nitride boat having a cavity with substantially uniform projected nodules that make the boat ideally suited for use in growing and doping semiconductor crystals, such as gallium arsenide (GaAs) crystals.

BACKGROUND OF THE INVENTION

The structure, physical properties, purity, and chemical inertness of pyrolytic boron nitride (PBN) make it an attractive container material for elemental purification, compounding, and growth of semi-conductor crystals. Examples include containers for liquid-encapsulated Czochralski (LEC) and vertical gradient freeze (VGF) growth of GaAs and other III-V and II-VI compound single crystals, and source containers for deposition of metals and dopants at high temperatures and ultra-high vacuum by molecular beam epitaxy (MBE). Recently, pyrolytic boron nitride has been used as a container for growth of GaAs crystals by a liquid encapsulated vertical zone melting process. GaAs crystals with extremely low carbon content have been produced in liquid-encapsulated Czochralski furnaces where the graphite furnace parts were coated with pyrolytic boron nitride.

Pyrolytic boron nitride can be produced by various methods such as the method disclosed in U.S. Pat No. 3,152,006, in which pyrolytic boron nitride is produced by the vapor-phase reaction of ammonia and boron halides, such as boron trichlorideg. By depositing the boron nitride produced in this manner upon a suitable mandrel, such as a graphite mandrel, a wide assortment of shapes can be produced. Boats of pyrolytic boron nitride have been produced in this manner with smooth surfaces that may be wetted by a molten element or compound. As used herein, wetting shall mean a physical surface reaction between a molten material and the surface of a boat which results in sticking and/or adhesion of the molten material on the surface. Wetting results in internal stress during solidification of the molten material (for example, an element or compound) and as a consequence, imperfect product may be produced. For example, when producing single crystals in smooth surface boats, the wetting of the walls by the molten material can cause internal stress during solidification which can result in imperfect crystal formation, i.e., polycrystal or twinning.

Most gallium arsenide single crystal is grown in quartz horizontal boats. This material is characterized by its low electrical resistance and high degree of crystal perfection. The low electrical resistance is generally a result of silicon contamination (autodoping) from the quartz boat. The level of autodoping is generally non-uniform along the boat length with the lowest level at the seed end. This autodoping of silicon from the quartz boat limits the crystal produced to applications not requiring high electrical resistance, i.e., light emitting-diodes. It is disclosed in the literature that twinning can be reduced by sandblasting the surface of the cavity of a quartz boat in which the single crystal is grown.

Elimination of silicon autodoping would improve electrical properties uniformity of these crystals and expand their use to applications requiring a high electrical resistance, i.e., integrated circuits. Pyrolytic boron nitride boats have been used to produce undoped high resistance gallium arsenide crystals in which the silicon contamination was effectively eliminated but, however, the formation of single crystal growth was hindered because of a surface reaction (wetting) between the gallium arsenide melt and the surface of the pyrolytic boron nitride boat. This interface problem cannot be overcome by sandblasting the pyrolytic boron nitride boat because of the laminar nature of the pyrolytic boron nitride structure. The thickness of the pyrolytic boron nitride lamina is generally too thin (about 0.5 mil thick) to allow sufficient surface roughness to occur before the entire lamina is removed and a fresh, smooth lamina exposed.

It is an object of the present invention to provide a process for producing a pyrolytic boron nitride boat having a cavity with a nodular surface that is ideally suited for use in the growth of single crystal materials.

It is another object of the present invention to provide a process for producing a pyrolytic boron nitride boat having a cavity with a nodular surface that is ideally suited for the growth of gallium arsenide.

It is another object of the present invention to provide a pyrolytic boron nitride boat having a cavity with a nodular surface that is ideally suited for the growth of gallium arsenide.

The foregoing and additional objects will become fully apparent from the following description and the accompanying drawings.

SUMMARY OF THE INVENTION

The invention relates to a process for producing a boron nitride boat with a cavity in which at least a portion of the cavity has a substantially uniform distribution of projected nodules, said process comprising the steps:

(a) preparing a mandrel having the shape of a desired boat to be produced and treating at least a portion of the mandrel, that corresponds to the cavity of the boat, to form a substantially uniform distribution of projected nodules on said portion of the mandrel and wherein said nodules have an average height of at least one mil; and (b) depositing boron nitride upon said mandrel of step (a) until the desired thickness of boron nitride is deposited on said mandrel, and removing the boron nitride boat from the mandrel, said boat having a cavity with a substantially uniform distribution of projected nodules having an average height of at least one mil.

The boron nitride could be deposited by reacting ammonia and a boron halide in a vapor phase at a temperature of from about 1450° C. to about 2300° C. under a pressure no greater than 50 mm, preferably no greater than 1 mm, of mercury absolute.

Generally, deposited boron nitride has a laminar structure and the laminae, which are stacks of crystalline basal planes, are between about 0.5 to 1.5 mils thick and typically about 0.5 mil thick. The height of the projected nodules on the surface of the boat shall preferably be more then the thickness of an individual lamina of the deposited boron nitride.

As used herein, boats shall mean crucibles or any other container which can be used in the art for single crystal growth.

As used herein, the term projected nodules shall mean a textured surface which has a plurality of uniform or non-uniform disturbances or ridges which project above the lowest plane of the surface. The disturbances should be at least one mil high and preferably about 1.5 to 3 mils high. Preferably, the height of the projected nodules or disturbances should be at least two times larger than the thickness of a lamina of the deposited pyrolytic boron nitride. As stated above, although sandblasting techniques can be used to provide a nodular surface, pyrolytic boron nitride has a laminar structure composed of smooth thin laminae and therefore sandblasting would essentially remove a lamina only to expose an under lamina which would be a smooth surface. To overcome this problem, the mandrel is prepared with a nodular surface so that as the pyrolytic boron nitride is deposited on the surface of the mandrel, each lamina will follow the, contour of the nodular surface. This will result in a boat having a cavity composed of thin laminae each of which has a nodular contour. Thus even if a pyrolytic boron nitride lamina is removed, the same nodular or textured surface will exist in the exposed new lamina thereby permitting multiple uses of the pyrolytic boron nitride boat. Generally, a conventional quartz boat is limited to one crystal growth cycle because of softening and deformation, sticking, vitrification or cracking. The novel pyrolytic boron nitride boat of this invention has a cavity with a nodular surface that is resistant to cracking and has non-sticking characteristics. Since the novel pyrolytic boron nitride boat of this invention is composed of a plurality of laminae, with each lamina having a nodular contour, the wearing away of the top lamina will expose a lamina having a similar nodular surface thus making the boat suitable for reuse without destroying the nodular surface characteristics of the boat. In addition, the pyrolytic boron nitride boat of this invention is believed to have the following benefits:

1) permits single crystal growth with higher yields than non-nodular surface pyrolytic boron nitride boats;
2) reduces production costs as compared to use of quartz boats;
3) allows production of undoped semi-insulating GaAs single crystals with low defect density; and
4) allows production of more uniformly doped semiconducting GaAs crystals with low defect density.

The mandrel, preferably made of graphite, can be made with a nodular surface by sandblasting, machining, distressing or fabricating the mandrel with coarse or porous graphite. At least the surface of the mandrel corresponding to the cavity of the boat shall be treated or fabricated with a nodular surface.

In order to produce the boats of the present invention, the boron nitride is deposited upon a mandrel having the same shape as the desired boat and the surface area on the mandrel corresponding to the cavity of the boat should have a nodular surface. The mandrel employed, of course, must be one which does not melt at the temperature at which the boron nitride is applied and which is inert to the boron halide and ammonia at such temperature. Generally, the mandrel employed is made of graphite.

Typically, the mandrel upon which the boron nitride boat is to be formed is mounted in a vapor deposition furnace and, after the furnace is heated to the desired temperature, the ammonia and boron halide gas, generally boron trichloride, are introduced into the reactor. The reaction between the ammonia and boron halide, and deposition of the boron nitride produced by this reaction, is typically effected at a temperature of from about 1450° C., to about 2300° C., and the reactor is accordingly maintained within this range. Preferably the temperature of the reactor is maintained between about 1850° C. and 1950° C.

The reactants are introduced into the reactor in vapor phase. Generally, at least 1 mole of ammonia is employed per mole of boron halide, with an excess of ammonia being preferred. Most preferably, from 2.5 to 3.5 moles of ammonia are employed per mole of boron halide, although even greater excesses can be employed if desired. The flow rate of the reactants through the reactor depends upon the specific design of the reactor and the size and shape of the mandrel upon which the boron nitride is to be deposited. Generally, flow rates of from about 0.2 standard cubic meters/hour to about 0.3 standard cubic meters/hour of ammonia and from about 0.06 standard cubic meters/hour to about 0.1 standard cubic meters/hour of boron halide per 1.5-2.5 cubic meters of furnace volume are suitable. If desired, an inert gas may be intermixed with the reactant gases.

After a suitable time, i.e., after the desired amount of boron nitride has been deposited on the mandrel, the flow of reactants into the reactor is interrupted and the reactor is cooled to room temperature. The pyrolytic boron nitride boat can then be removed from the mandrel and, if necessary, cut to a desired length and cleaned.

BRIEF DESCRIPTION OF THE DRAWINGS

FIG. 1 is an isometric view of a boat of this invention for growing single crystals.

FIG. 2 is a greatly enlarged cross-sectional view of FIG. 1 taken through line A—A showing the laminated structure of the pyrolytic boron nitride material.

FIG. 2a is an enlarged fragmentary view of the laminated structure of the pyrolytic boron nitride material of FIG. 2.

FIG. 3 is a greatly enlarged cross-sectional view of a conventional pyrolytic boron nitride boat showing the laminated structure of the pyrolytic boron nitride material.

FIG. 1 shows a pyrolytic boron nitride boat 2 having a cavity 4 and upstanding wall 6. The internal surface 8 of cavity 4 has a nodular surface which will reduce the tendency of the crystal melt in said cavity 4 to wet the surface while also reducing the drag that causes stress on the crystal melt during solidification. The use of a pyrolytic boron nitride boat 2 with a nodular surface 8 will improve the yield of single crystals. FIG. 2 is a cross-section of the pyrolytic boron nitride boat 2 of FIG. 1 greatly enlarged to show the laminated structure of the pyrolytic boron nitride. Specifically, the pyrolytic boron nitride boat 2 is comprised of a plurality of laminae 10 each having a nodular surface 12. This laminated structure is formed by depositing pyrolytic boron nitride onto a mandrel having a nodular surface on at least the area corresponding to the cavity 4 of boat 2. As shown in FIG. 2a, the projected nodules 3 have a height D which is measured from the plane of the lowest point 5 as shown by the broken lines to the top of the projected nodules 3. The height of the nodules should preferably be greater than the height of an individual lamina of the deposited pyrolytic boron nitride laminated structure, and most preferably greater than two times the thickness of the individual lamina. The laminar nature of the deposited pyrolytic boron nitride structure results in individual thin lamina being deposited on the mandrel and all such laminae have the nodular surface contour corresponding to the nodular surface of the mandrel. As stated above, even if a portion of the top lamina is removed, the same textured or nodular contour exist in the newly exposed lamina thus permitting multiple uses of the pyrolytic boron nitride boat without requiring further surface preparation.

FIG. 3 shows an enlarged cross-section of a conventional pyrolytic boron nitride boat 14 comprised of a laminated structure. The pyrolytic boron nitride boat 14 is comprised of a plurality of smooth laminae 16. The laminae 16 of the conventional pyrolytic boron nitride boat 14 usually is about 0.5 mil thick. Thus to impart a nodular surface to a conventional pyrolytic boron nitride boat by sandblasting would be ineffective since the laminae of the pyrolytic boron nitride are too thin to allow sufficient surface roughness to occur before the entire top lamina is removed and a fresh, smooth lamina is exposed. Contrary to this, the pyrolytic boron nitride boat of the subject invention is comprised of a plurality of laminae each having a nodular contour surface. In addition, it is believed that sandblasting of a pyrolytic boron nitride boat could expose the edge planes of the deposited lamina of the boron nitride and these edges are believed to be more wettable than the basal planes produced by the boron nitride deposition.

EXAMPLE

A graphite mandrel was produced havinq a shape of the desired boat. The graphite mandrel after machining was sandblasted with 60 mesh (0.42 mm) $Al_2O_3$ grit at 2 kg/cm$^2$ air pressure. The surface of the graphite mandrel was held about 20 to 25 cm from the nozzle of the sandblaster machine. The mandrel was mounted in a 0.33 cubic meter vapor deposition furnace. The pressure in the furnace was reduced to 0.5 mm of mercury absolute and the temperature was raised to 1900° C. Gaseous boron trichloride and ammonia were then introduced into the reactor. The flow rate of the ammonia through the reactor was 1.5 standard cubic meters/hour, and the flow rate of the boron trichloride was 2.0 standard cubic meters/hour. After 40 hours of operation, the flow of ammonia and boron trichloride was stopped. After the reactor had cooled to room temperature, the multi-laminated pyrolytic boron nitride boat was easily removed from the graphite mandrel and had a nodular surface in the cavity.

The pyrolytic boron nitride boat of this invention is believed to be beneficial to produce GaAs single crystals using conventional technology. It is also believed that the boat of this invention will permit single crystal growth with higher yields than conventional non-nodule pyrolytic boron nitride boats.

It is to be understood that although the present invention has been described with reference to many particular details thereof, it is not intended that these details shall be construed as limiting the scope of this invention. For example, the boat of this invention could comprise a graphite boat that is treated to have a nodular surface and then the pyrolytic boron nitride could be vapor-deposited onto the graphite substrate to yield a pyrolytic boron nitride boat having a nodular surface at least in the area defining the cavity.

It is also within the scope of this invention to use a female mandrel or male mandrel to make the boron nitride boat. Preferably, a male mandrel would be used to produce the boron nitride boat.

What is claimed is:

1. A process for producing a boron nitride boat with a cavity in which at least a portion of the cavity has a substantially uniform distribution of projected nodules, said process comprising the steps:
   a) preparing a mandrel having the shape of a desired boat to be produced and treating at least a portion of the mandrel to produce a substantially uniform distribution of projected nodules on said portion of the mandrel;
   b) depositing boron nitride upon said mandrel of step a);
   c) continuing the deposition of boron nitride until the desired thickness of boron nitride is deposited on the mandrel; and
   d) removing the boron nitride boat from the mandrel, said boat having a cavity with a substantially uniform distribution of projected nodules.

2. The process of claim 1 wherein said nodule surface on the mandrel in step a) is produced by sandblasting.

3. The process of claim 1 wherein the average height of the projected nodules on the mandrel in step a) is at least one mil.

4. The process of claim 1 wherein the average height of the projected nodules on the mandrel in step a) is from about 1.5 to 3.0 mils.

5. The process of claim 4 wherein the average height of the projected nodules on the mandrel in step a) is about 1.5 mils.

6. The process of claim 1 wherein said boron nitride has a laminar structure composed of a plurality of laminae and the average height of the projected nodules is at least two times the thickness of a lamina of the boron nitride.

7. The process of claim 1 wherein in step b) the boron nitride is deposited by reacting ammonia and a boron halide in vapor phase at a temperature of from about 1450° C. to about 2300° C. under a pressure no greater than about 50 mm of mercury absolute.

8. A process as in claim 7 wherein the boron halide is boron trichloride.

9. A process as in claim 8 wherein the mandrel is made of graphite.

10. A process as in claim 7 wherein the ammonia and boron halide are reacted at a pressure below about 1.0 mm of mercury absolute.

11. A process as in claim 10 wherein the boron halide is boron trichloride.

12. A process as in claim 11 wherein the mandrel is made of graphite.

13. A process as in claim 7 wherein the ammonia and boron halide are reacted at a temperature of from about 1850° C. to about 1950° C.

14. A process as in claim 13 wherein the boron halide is boron trichloride.

15. A process as in claim 14 wherein the mandrel is made of graphite.

16. A process as in claim 13 wherein the ammonia and boron halide are reacted at a pressure below about 1.0 mm of mercury absolute.

17. A process as in claim 16 wherein the boron halide is boron trichloride.

18. A process as in claim 17 wherein the mandrel is made of graphite.

* * * * *